(12) United States Patent
Tran

(10) Patent No.: US 6,763,502 B2
(45) Date of Patent: Jul. 13, 2004

(54) METHOD AND SYSTEM FOR SEARCHING A MICROELECTRONIC DEVICE PHYSICAL LAYOUT

(75) Inventor: Trung Tran, Round Rock, TX (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/283,557

(22) Filed: Oct. 30, 2002

(65) Prior Publication Data

US 2004/0088660 A1 May 6, 2004

(51) Int. Cl.[7] .............................................. G06F 17/50
(52) U.S. Cl. ........................ 716/3; 716/11; 716/10
(58) Field of Search .............................. 716/1, 2, 3, 4, 716/5, 6, 10, 11, 19, 21, 20, 8, 9, 12, 13, 17, 18; 703/1, 8, 6, 13, 14

(56) References Cited

U.S. PATENT DOCUMENTS

| 6,308,143 | B1 | * | 10/2001 | Segawa | 703/1 |
| 6,453,447 | B1 | * | 9/2002 | Gardner et al. | 716/3 |
| 6,532,581 | B1 | * | 3/2003 | Toyonaga et al. | 716/11 |
| 6,598,211 | B2 | * | 7/2003 | Zachariah et al. | 716/4 |
| 6,622,293 | B1 | * | 9/2003 | Suzuki et al. | 716/12 |
| 6,629,292 | B1 | * | 9/2003 | Corson et al. | 716/3 |
| 2003/0135829 | A1 | * | 7/2003 | Garrepally et al. | 716/3 |

* cited by examiner

*Primary Examiner*—Vuthe Siek
*Assistant Examiner*—Binh Tat
(74) *Attorney, Agent, or Firm*—Hamilton & Terrile, LLP; Robert W. Holland

(57) ABSTRACT

Search functions of a physical layout tool are performed by converting a given physical layout name and selected searching layout names from string representations into numerical representations and comparing the converted numerical representation of the given physical layout name with the converted numerical representations of searching physical layout names until a match occurs. In one embodiment, metal and via layer numbers included in string representations of physical layout names are converted to integer values by selecting number characters from predetermined positions in a string, such as number characters that identify the metal or via layer.

20 Claims, 3 Drawing Sheets

METHOD AND SYSTEM FOR SEARCHING A MICROELECTRONIC DEVICE PHYSICAL LAYOUT

BACKGROUND OF THE INVENTION

1. Field of the Invention

The present invention relates in general to the field of microelectronic device physical layout, and more particularly to a method and system for searching a microelectronic device physical layout to find a physical layout name.

2. Description of the Related Art

Microelectronic devices operate to process signals through a complex arrangement of circuits that are typically fabricated with metal deposited within a semiconductor material such as silicon. Microelectronic devices are typically fabricated in layers with a bottom layer having transistors that perform logical operations and with subsequent alternating metal and via layers. The metal layers have intricate wire line designs that communicate electronic signals. The via layers insulate metal layers from each other and interconnect wire lines between metal layers to support processing of signals between metal layers and into logical circuits. In order to enhance microelectronic device performance, industry has worked to fit greater numbers of transistors and wire lines into microelectronic devices by fabricating devices with smaller dimensions. As a result, microelectronic devices have grown increasingly complex with greater numbers of metal and via layers that have greater numbers of inlaid metal designs of smaller dimensions.

Physical layout tools are typically used to aid in the design of microelectronic devices. Physical layout tools provide computer-aided physical layout designs for metal and via layers of microelectronic devices. Physical layout tools output metal and via layer designs as electronic data that is used to fabricate physical devices to accomplish circuit design goals. For a physical layout, metal and via layers are typically defined and formed by a letter concatenated by a positive integer number. For instance, metal layers are typically identified with the letter "m" or "M" and via layers are typically identified with the letter "v" or "V." Thus, for example, a microelectronic device with nine metal layers and eight via layers will define the metal layers with layout names that use "m1" through "m9" and will define the via layers with layout names that use "v1" through "v8."

During a physical layout design, a physical layout tool searches for particular physical layout names to perform layout design functions. For instance, a series of searches may be used to prepare alternative arrangements of metal and via layers to accomplish design goals. Searches by a physical design tool for particular physical layout names typically use a search function that compares a string representation of a given physical layout name with stored physical layout name string representations to look for an exact match. The search for the given physical layout name may be done through a file, array or linked list of stored physical layout names. For instance, a physical layout tool may read selected stored physical layout names directly from a file to search by comparing the selected physical layout name with the given physical layout name to determine if the physical layout names match. Alternatively, to speed the search process, a physical layout tool may read and search through an array or a linked list.

Regardless of the manner that physical layout data is stored and searched, search functions for string representations of a given physical layout name involve four machine executions. One machine execution stores the searching string selected from the stored data in a register. Another machine execution stores the given string in a separate register. A third machine execution compares the strings stored in the two registers and a fourth machine execution puts the results of the comparison in a third register. The execution time used to obtain a search result depends upon the size of the physical layout file or the size of the array or linked list. Complex physical layouts often are stored as large files or array/linked lists that tend to require longer execution times to obtain search results. Over a design process for a complex microelectronic device, the lengthy execution times for searches often cumulate into substantial design delays.

SUMMARY OF THE INVENTION

In accordance with the present invention, a method and system are provided which improve search functions of physical layout tools that search a microprocessor device physical layout definition to find a given physical layout name. A name conversion module associated with a physical layout tool search function converts physical layout name string representations into numerical representations to allow the search function to compare numerical instead of string representations. A comparison of a given physical layout name numerical representation with a numerical representation of a searching physical layout name selected from a file, array or linked list uses a single machine execution compared with the multiple machine executions performed with the comparison of string representations. The reduction in machine operations reduces the execution time for physical layout tools to perform search functions. In one embodiment, string representations of physical layout names are converted to numerical representations by using the layer number of a physical layout name as an index to represent a metal string or via string. For instance, a number in a physical layout name is converted from a string value to an integer value and indexed with a metal array or via array. Alternatively, layer names that do not include a number are arbitrarily assigned a unique number that is used to represent the layer name.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The present invention improves physical layout tool searching functions that search for physical layout names by taking advantage of greater speeds available in the performance of number comparisons versus string comparisons.

Figure 1A:
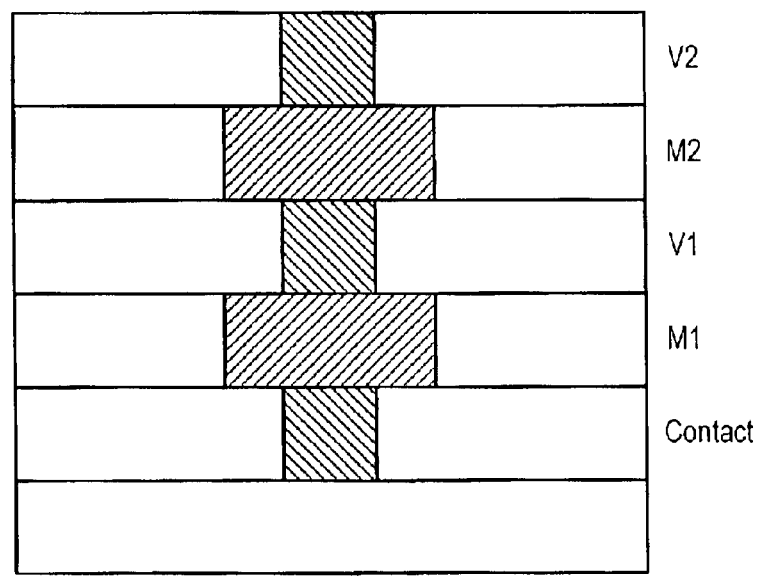
FIG. 1A depicts a side cutaway view of a microelectronic device having plural metal and via layers.
Figure 1B:
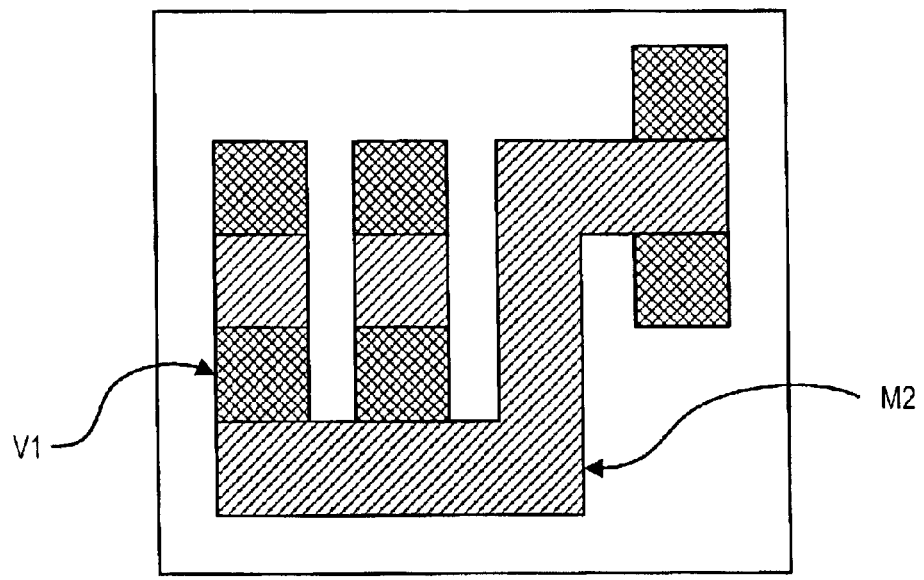
FIG. 1B depicts a top view of a metal layer over a via layer.

Physical layout names are converted from string representations to number representations. Number representations are compared to determine a match with a single machine execution versus the four executions generally required to perform a comparison of string representations. The reduced execution time for number comparisons of physical layout names provides results for physical layout tool search functions in reduced time, resulting in substantial reductions in design time for complex microelectronic devices. FIGS. 1A and 1B depict side cutaway and top views respectively of a simplified example of a microelectronic device. Metal layers M1 and M2 communicate signals across the device and via layers V1 and V2 communicate signals between metal layers. For instance, signals transverse across metal wire lines and through vias to perform logical operations through the contact layer.

Figure 2:
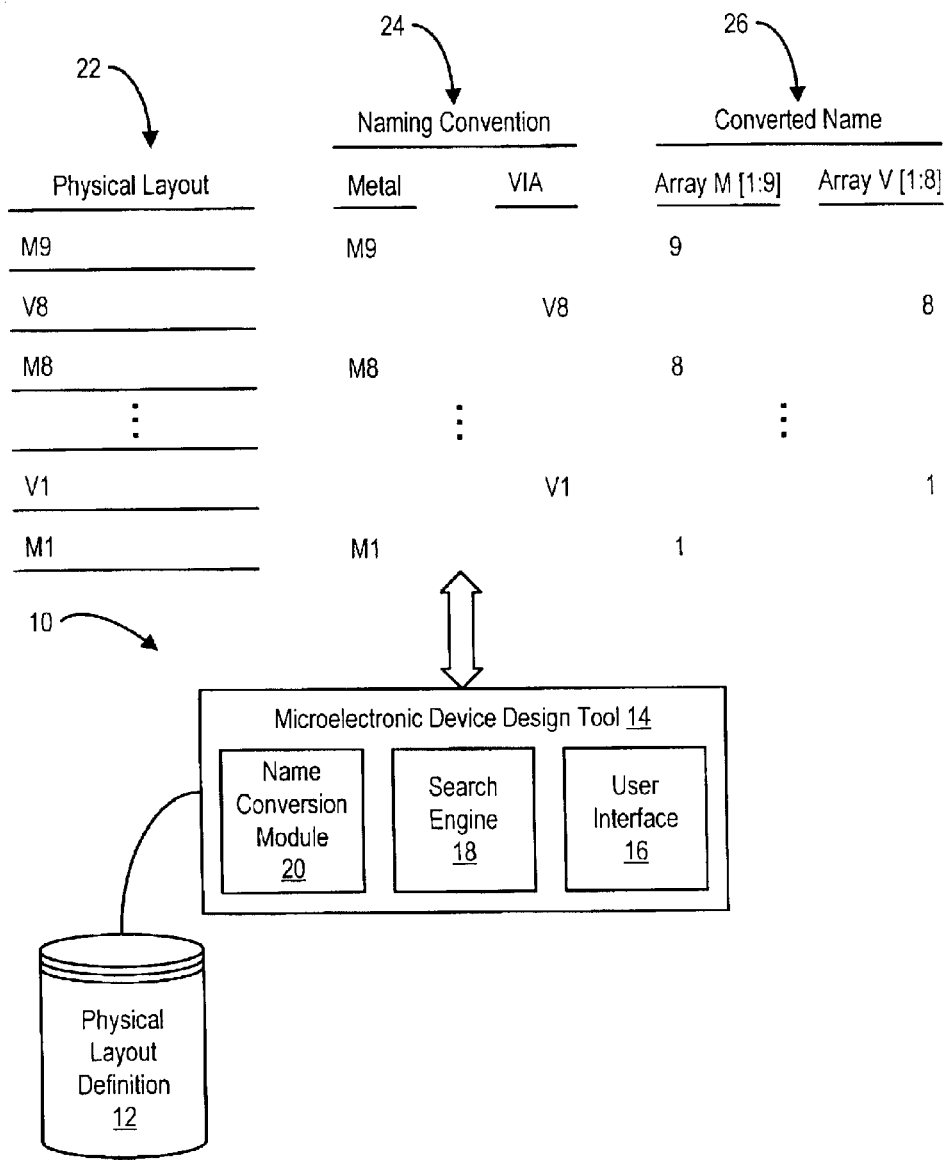
FIG. 2 depicts a block diagram of a system for converting string representations of physical layout names to numerical representations.
Figure 3:
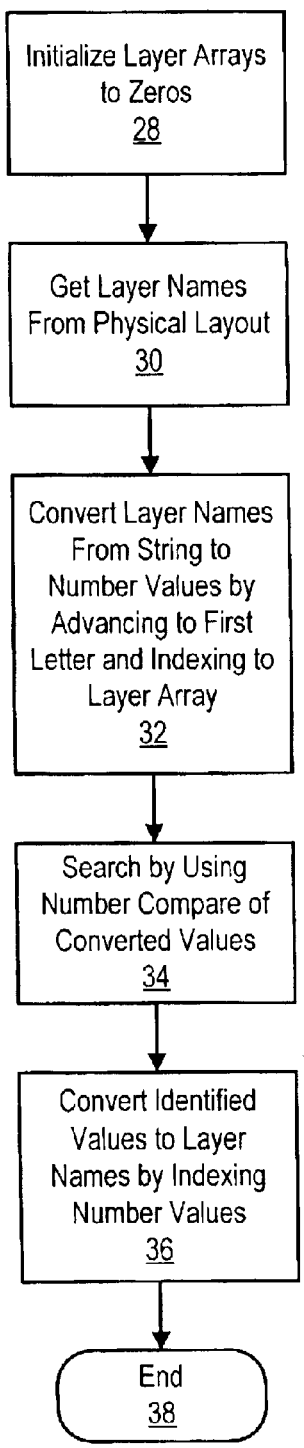
FIG. 3 depicts a flow diagram of a process for converting string representations of physical layout names to numerical representations.

Referring now to FIG. 2, a block diagram depicts a microelectronic device design tool system 10 that improves physical layout name search times for physical layout names of a physical layout definition 12. Physical layout definition 12 is a file or set of files that defines microelectronic device designs with physical layout names. Alternatively, physical layout definition 12 may allow access to physical layout names through an array or linked list arranged to improve search efficiency input and output. A microelectronic device design tool 14 interacts with physical layout definition 12 to perform microelectronic design functions in response to user inputs through a user interface 16. When design functions, such as preparing or changing a circuit within a microelectronic device, call for searching physical layout definition 12, search engine 18 compares a given physical layout name with physical layout names from physical layout definition 12 until a match is found. A name conversion module 20 converts the given physical layout name and the searching physical layout names selected from physical layout definition 12 from string representations to numerical representations for numerical comparisons by search engine 18.

A physical layout view 22, naming configuration view 24 and converted name view 26 depict the relationship between the physical layout of a microelectronic device and the generation of names for use by search engine 18. Physical layout view 22 depicts alternating metal and via layers of a microelectronic device. The first layer is a metal layer labeled M1 that includes metal wire line circuits. Above metal layer M1, a via layer labeled V1 insulates metal layer M1 from the subsequent metal layers and also interconnects circuits of metal layer M1 with circuits in subsequent metal layers. In the example depicted by FIG. 1, the microelectronic device includes nine metal layers M1–M9 alternating with eight via layers V1–V8. Microelectronic device design tool 14 designs circuits and interconnects for a physical layout of a microelectronic device using the naming convention depicted by naming convention view 24. Each physical layout name includes a reference to the physical layout layer with which it is associated. For instance, a physical layout name for a physical layout structure located in the eighth metal layer includes the string representation M8, with the letter M indicating a metal layer and concatenated by the positive integer 8 indicating the eighth layer. Similarly, a physical layout name for a physical layout structure located in the eighth via layer includes the string representation V8, with the letter V indicating a via layer and concatenated by the positive integer 8 indicating the eighth layer.

Converted name view 26 depicts the conversion of physical layout name string representations into numerical representations. The strings of the naming convention use M to represent metal layer names and V to represent via layer names with letters placed in a predetermined position relative to the concatenated number. Conversion module 20 uses the relationship in the positions of the letters and numbers to convert string representations to metal representations by using the layer number as an index to represent the string. For example, for the metal layers an index from 1 to 9 is used to represent layers M1 to M9 in the M array of M[1:9]:

| | | |
|---|---|---|
| 1 | -> | M1 |
| 2 | -> | M2 |
| 3 | -> | M3 |
| 4 | -> | M4 |
| 5 | -> | M5 |
| 6 | -> | M6 |
| 7 | -> | M7 |
| 8 | -> | M8 |
| 9 | -> | M9 |

Similarly, for the via layers an index from 1 to 8 is used to represent layers V1 to V8 in the V array of V[1:8]:

| | | |
|---|---|---|
| 1 | -> | V1 |
| 2 | -> | V2 |
| 3 | -> | V3 |
| 4 | -> | V4 |
| 5 | -> | V5 |
| 6 | -> | V6 |
| 7 | -> | V7 |
| 8 | -> | V8 |

To perform the conversion, conversion module 20 advances to the predetermined position of the numerical character of the physical layout name and converts the string representation of the number to an integer numerical representation.

Searches performed on the converted numerical representations use only a single machine operation to compare numerical values. As a simplified example, consider an application that calculates the total number of each metal layer in a microprocessor device. The metal array M[i] is initialized to zeros where $0<=i<=9$, and then for each layer name, name conversion module 20 advances to the second character of the name and converts the second character string number to an integer value: Mi converts to i where $1<=i<=9$. The application is then able to calculate the total number of each metal layer with a series of numerical comparisons that each use a single machine execution:

```
If (i == 1)
    M[1] = M[1] + 1
If (i == 2)
    L[2] = L[2] + 1
    * * *
If (i == 9)
    L[9] = L[9] + 1
```

Specifically, the "If" number comparisons each use a single machine execution whereas string comparisons would have required two machine executions.

Referring now to FIG. 2, a flow diagram depicts a process for converting string representations of physical layout names to numerical representations. The process starts at step 28 with the initialization of layer arrays to zeros, such as a metal array M and a via array V. At step 30, the layer names are retrieved from the physical layout definition. At step 32, the layer names are converted from string to number values by advancing to the first letter of each layer name and indexing the next character number to the appropriate layer array with the character number's integer value. In the example described above, the first character is a letter that defines the layer name as either metal or via and the second character is a number that defines the layer number. However, in alternative embodiments the number character may be placed in alternative predetermined locations so that name conversion module advances to the predetermined placement of the number character. Layer names that lack a number character may be indexed by arbitrarily assigning them to an unique number and using that unique number to represent them. Once the arrays are populated, at step 34 searches are performed by using number comparisons of converted characters to locate searching physical layout names selected from the physical layout definition that match a given physical layout name. At step 36, after a match is found, the identified value is converted back to the layer name convention by indexing the number values to the layer arrays, and the process ends at step 36.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may he used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A system for searching a microelectronic device physical layout, the system comprising:
   a physical layout definition having plural physical layout names defined by one or more associated physical layout layers, each physical layout layer represented by a string having at least one letter;
   a name conversion module operable to convert the physical layout names of the physical layout definition from the string representation to a numerical representation having only numbers; and
   a search engine operable to find a selected physical layout name by comparing a numerical representation of the selected physical layout name with the converted physical layout names of the physical layout definition.

2. The system of claim 1 wherein the physical layout layers comprise metal and via layers.

3. The system of claim 1 wherein the name conversion module converts the physical layout names by assigning a unique number to represent the string letter.

4. The system of claim 1 wherein each physical layout name comprises a letter associated with the physical layout layer type followed by an identification number, and wherein the name conversion module converts the physical layout definition by advancing to the letter and indexing the identification number to the letter.

5. The system of claim 4 wherein the physical layout layer type comprises a metal layer and a via layer.

6. The system of claim 5 wherein the metal layer and via layer are each indexed with an array.

7. The system of claim 1 wherein the name conversion module is further operable to convert physical layout names found by the search engine from the numerical representation to a string representation for display as output.

8. A method for searching a physical layout definition of a microelectronic device for a given physical layout name, the physical layout definition having plural physical layout names, each physical layout name having a string representation, the method comprising:
   converting the given physical layout name from the string representation to a numerical representation;
   selecting a physical layout name from the physical layout definition;
   converting the selected physical layout name from the string representation to a numerical representation; and
   comparing the given physical layout name numerical representation and the selected physical layout name numerical representation to determine a match of the given and selected physical layout names.

9. The method of claim 8 further comprising:
   sequentially selecting and converting physical layout names from the physical layout definition until a given and selected physical layout name match.

10. The method of claim 8 wherein a string representation comprises one or more letters identifying a metal layer of the microelectronic device.

11. The method of claim 8 wherein a string representation comprises one or more letters identifying a metal layer of the microelectronic representation.

12. The method of claim 8 wherein the physical layout name comprises a letter and a number, the letter having a predetermined position relative to the number, and wherein converting further comprises:
   advancing in the string representation to the predetermined position;
   indexing the sting representation with a number proximate the determined position; and
   converting the number from representation to a numerical representation.

13. The method of claim 12 wherein the number proximate the predetermined position is associated with a metal or via layer of the microelectronic device, and wherein indexing further comprises:

representing metal layers of the microelectronic device with a first array having a numerical value for each metal layer;

representing via layers of the microelectronic device with a second array having a numerical value for each via layer; and associating physical layout names having a first letter with the first array and associating physical layout names having a second letter with the second array.

14. The method of claim 12 wherein comparing further comprises comparing the converted number of the selected physical layout name with the converted number of the given physical layout name.

15. The method of claim 8 wherein converting a physical layout name from a string representation to a numerical representation further comprises:

determining that the physical layout name string representation lacks a number;

assigning a unique number to each layer of the microelectronic device physical layout definition;

determining the layer associated with each physical layout name; and indexing each physical layout name to the unique number associated with the determined layer.

16. A microelectronic device physical layout tool comprising:

a physical layout definition having plural physical layout names stored as string representations;

a search engine operable to search the physical layout definition for a given physical layout name by performing numerical comparisons; and a name conversion module interfaced with the physical layout definition and the search engine, the name conversion module operable to convert string representations of physical layout names into numerical representations for use by the search engine.

17. The physical layout tool of claim 16 wherein the name conversion module converts string representations into numerical representations by assigning a unique number to each layer of the physical layout definition and using the unique numbers to represent physical layout names associated with the layers.

18. The physical layout tool of claim 16 wherein the physical layout definition comprises metal physical layout names associated with metal layers, each metal physical layout name having a string representation letter and number in predetermined positions, the conversion module operable to advance to the predetermined position of the number and use the numerical value of the number to represent the physical layout name string.

19. The physical layout tool of claim 16 wherein the physical layout definition comprises via physical layout names associated with via layers, each via physical layout name having a string representation letter and number in predetermined positions, the conversion module operable to advance to the predetermined position of the number and use the numerical value of the number to represent the physical layout name string.

20. The physical layout tool of claim 16 wherein the physical layout definition comprises metal and via layers and the conversion module is further operable to index the physical layout names associated with metal layers to a metal array and to index the physical layout names associated with via layers to a via array.

* * * * *